(12) United States Patent
Ramesh et al.

(10) Patent No.: US 6,432,546 B1
(45) Date of Patent: Aug. 13, 2002

(54) MICROELECTRONIC PIEZOELECTRIC STRUCTURE AND METHOD OF FORMING THE SAME

(75) Inventors: Ramoothy Ramesh, Silver Spring; Yu Wang, Greenbelt, both of MD (US); Jeffrey M. Finder, Chandler, AZ (US); Kurt Eisenbeiser, Tempe, AZ (US); Zhiyi Yu, Gilbert, AZ (US); Ravindranath Droopad, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/624,527

(22) Filed: Jul. 24, 2000

(51) Int. Cl.⁷ ................................. B32B 9/00
(52) U.S. Cl. ................. 428/448; 428/446; 428/469; 428/472; 428/697; 428/688; 428/699; 428/700; 428/701; 428/702
(58) Field of Search ............................ 428/469, 471, 428/688, 689, 697, 699, 700, 701, 702

(56) References Cited

U.S. PATENT DOCUMENTS

| | | |
|---|---|---|
| 4,882,300 A | 11/1989 | Inoue et al. |
| 4,999,842 A | 3/1991 | Huang et al. |
| 5,155,658 A | 10/1992 | Inam et al. |
| 5,248,564 A | 9/1993 | Ramesh |
| 5,270,298 A | 12/1993 | Ramesh |
| 5,310,707 A | 5/1994 | Oishi et al. |
| 5,326,721 A | 7/1994 | Summerfelt |
| 5,418,389 A | 5/1995 | Watanabe |
| 5,674,366 A | 10/1997 | Hayashi et al. |
| 5,731,220 A | 3/1998 | Tsu et al. |
| 5,801,105 A | 9/1998 | Yano et al. |
| 5,828,080 A | 10/1998 | Yano et al. |
| 5,874,860 A | 2/1999 | Brunel et al. |
| 6,002,375 A | 12/1999 | Corman et al. |
| 6,055,179 A | 4/2000 | Koganei et al. |

OTHER PUBLICATIONS

Nagarja et al (Appl. Phys. Lett., vol. 74, No. 21, May 1999, pp. 3194–3196).*
Dhote et al (Appl. Phys. Lett., vol. 68, No. 10, Mar. 1996, pp. 1350–1352).*
"Optimizing GMR Spin Valves: The Outlook for Improved Properties,"W.F. Englhoff et al., 1988 Int'l Non Volatile Memory Technology Conference, pp. 34–37.
"Processing and Performance of Piezoelectric Films", Y. Wang et al., Univ. of MD, Wilcoxon Research Co., and Motorola Labs.
"Nonlinear acoustoelectric interactions in $GaAs/LiNbO_3$ structures", M. Rotter et al., 1999 American Institute of Physics, pp. 965–967.
"Surface acoustic wave propagation on lead zirconate titanate thin films", K. Sreenivas et al., App. Phys. Lett. 52(9), Feb. 29, 1988, pp. 709–711.
"Single Chip fused hybrids for acousto–electric and acousto–optic applications", M. Rotter et al., 1997 American Institute of Physics, pp. 2097–2099.
"Surface Acoustic Wave Propagation in $PZT/YBCO/SrTiO_3$ and $PbTi\ O_3/YBCO/SrTiO_3$ Epitaxial Heterostructures", Dept. of Physics & Astrophysics, Univ. of Delhi, pp. 275–283.

(List continued on next page.)

Primary Examiner—Deborah Jones
Assistant Examiner—A B Sperty
(74) Attorney, Agent, or Firm—William E. Koch

(57) ABSTRACT

A high quality epitaxial layer of monocrystalline $Pb(Zr,Ti)O_3$ can be grown overlying large silicon wafers by first growing an strontium titanate layer on a silicon wafer. The strontium titanate layer is a monocrystalline layer spaced apart from the silicon wafer by an amorphous interface layer of silicon oxide.

16 Claims, 1 Drawing Sheet

OTHER PUBLICATIONS

"Ferroelectric Field Effect Transistor Based on Epitaxial Perovskite Heterostructures", S. Matthews et al., American Association for the Advancement of Science, 1997, pp. 238–240.

"Formation of Si Epi./MgO–$Al_2O_3$ Epi./$SiO_3$/Si and Its Epitaxial Film Quality," Masao Mikami et al., Fundamental Research Laboratories and Microelectronics Laboratories, pp. 31–34, No Date.

"An Epitaxial Si/Insulator/Si Structure Prepared by Vacuum Deposition of $CaF_2$ and Silicon," T. Asano et al., Graduate School of Science and Engineering, Tokyo Institute of Technology, pp. 143–151, No Date.

"Reaction and Regrowth Control of $CeO_2$ on Si(111) Surface for the Silicon–On–Insulator Structure," T. Chikyow et al., Appl. Phys. Lett. 65(8), Aug. 22, 1994, pp. 1030–1032.

"Epitaxial Growth of $CeO_2$(100) Films on Si(100) Substrates by Dual Ion Beams Reactive No Sputtering," J.F. Kang et al., Solid State Communications, vol. 108, No. 4, pp. 225–227, No Date.

"Vertical–Cavity Surface–Emitting Lasers Come of Age," Robert A. Morgan et al., SPIE, vol. 2683, pp. 18–29, No Date.

"Technical Analysis of Qualcomm QCP–800 Portable Cellular Phone(Transmitter Circuitry)," Talus Corporation, Qualcomm QCP–800 Technical Analysis Report, Dec. 10, 1996, pp. 5–8.

Ghonge, S.G. et al., Microstructure of Epitaxial Oxide Thin Film Heterostructures on Silicon by Pulsed Laser Deposition, Applied Physics Letters, vol. 64, No. 25, Jun. 20, 1994, pp. 3407–3409.

Cheung, J.T. et al., "Epitaxial La0.5Sro.5CoO3 Electrode Films for Ferroelectric Device Applications," Integrated Ferroelectrics, vol. 4, No. 2, 1993, pp. 147–157.

Wu, W. et al., "Low–temperature Growth and Characterization of Epitaxial La0.5Sr0.5CoO3/Pb(Zr0.52Ti0.48)O3/La0.5Sr0.5CoO3 Capacitors on SrTiO3/TiN Buffered Si(001) Substrates," Journal of Physics D(Applied Physics), bol. 34, No. 11, Jun. 2001, pp. 1587–1591.

Wang, Y. et al., "Epitaxial Ferroelectric Pb(Zr,Ti)O3 Thin Films on Si Using SrTiO3 Template Layers," Applied Physics Letters, vol. 80, No. 1, Jan. 7, 2002, pp. 97–99.

\* cited by examiner

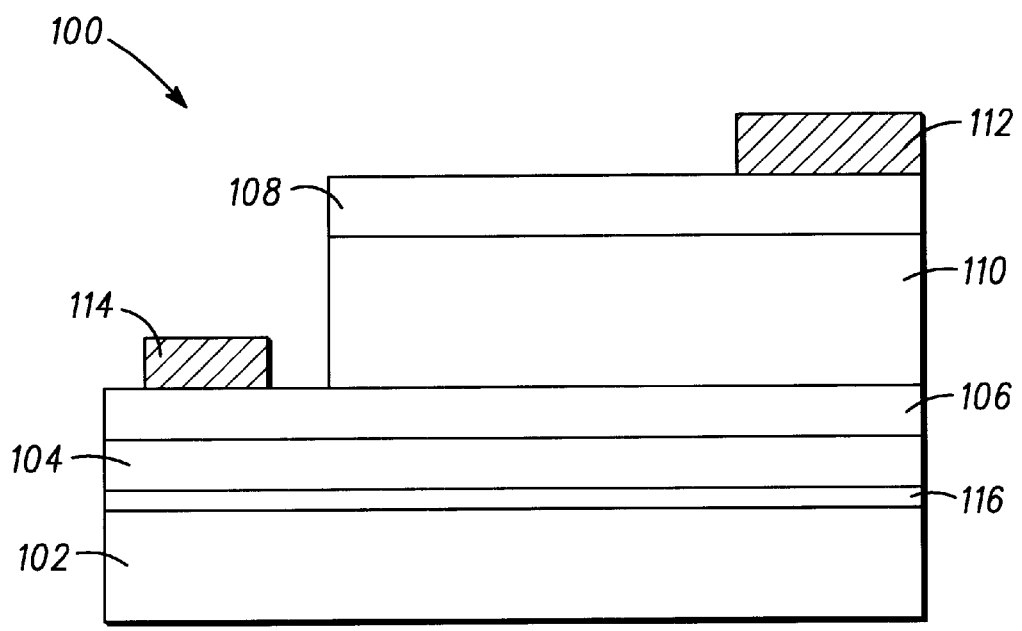

MICROELECTRONIC PIEZOELECTRIC STRUCTURE AND METHOD OF FORMING THE SAME

FIELD OF THE INVENTION

This invention relates generally to microelectronic structures and devices and to a method for their fabrication, and more specifically to structures and devices including piezoelectric thin films and to the fabrication and use of the structures and devices.

BACKGROUND OF THE INVENTION

Piezoelectric materials are useful for a variety of applications. For example, piezoelectric material is often used to form pressure gauges, transducers, tactile sensors, robotic manipulator, high frequency sound generators, frequency control circuits, and oscillators.

Generally, the desirable characteristic of the piezoelectric material, i.e., the piezoelectric effect, increases as the crystallinity of the material increases. Accordingly piezoelectric material of high crystalline quality if often desired.

Piezoelectric material is relatively expensive in bulk form compared to other materials used to form microelectronic devices such as microelectronic pressure sensors, oscillators, and the like. Because of their present generally high cost and low availability in bulk form, for many years attempts have been made to grow thin films of the piezoelectric materials on a foreign substrate. To achieve optimal characteristics of piezoelectric material, however, a monocrystalline film of high crystalline quality is desired. Attempts have been made, for example, to grow layers of a monocrystalline piezoelectric material on substrates such as silicon. These attempts have generally been unsuccessful because lattice mismatches between the host crystal and the grown crystal have caused the resulting thin film of piezoelectric material to be of low crystalline quality.

If a large area thin film of high quality monocrystalline piezoelectric material was available at low cost, a variety of semiconductor microelectronic devices could advantageously be fabricated using that film at a low cost compared to the cost of fabricating such devices on a bulk wafer of the piezoelectric material. In addition, if a thin film of high quality monocrystalline piezoelectric material could be realized on a bulk wafer such as a silicon wafer, an integrated device structure could be achieved that took advantage of the best properties of both the silicon and the piezoelectric material.

Accordingly, a need exists for a microelectronic structure that provides a high quality monocrystalline piezoelectric film over another monocrystalline. material and for a process for making such a structure.

BRIEF DESCRIPTION OF THE DRAWING

The present invention is illustrated by way of example and not limitation in the accompanying FIGURE, which illustrates, schematically, in cross section, a device structure in accordance with the present invention.

DETAILED DESCRIPTION OF THE DRAWING

The drawing FIGURE illustrates schematically, in cross section, a portion of a microelectronic structure 100 in accordance with an embodiment of the invention. Structure 100 may be used to form, for example, piezoelectric actuators, piezoelectric transducers, as well as ferroelectric memory cells.

Microelectronic structure 100 includes a monocrystalline silicon substrate 102, a monocrystalline $(Ba,Sr)TiO_3$ layer 104, layers 106 and 108 of conductive, monocrystalline $(La,Sr)CoO_3$, a monocrystalline $Pb(Zr,Ti)O_3$ or PZT layer 110, a first electrode 112, and a second 114. As used throughout this document, the term "monocrystalline" shall have the meaning commonly used within the semiconductor industry. The term shall refer to materials that are a single crystal or that are substantially a single crystal and shall include those materials having a relatively small number of defects such as dislocations and the like as are commonly found in substrates of silicon or germanium or mixtures of silicon and germanium and epitaxial layers of such materials commonly found in the semiconductor industry. In accordance with the invention, structure 100 also includes an amorphous intermediate layer 116 positioned between substrate 102 and accommodating buffer layer 104.

Substrate 102, in accordance with an embodiment of the invention, is preferably a high quality monocrystalline silicon wafer as used in the semiconductor industry. Monocrystalline $(Ba,Sr)TiO_3$ layer 104 is preferably a monocrystalline strontium titanate material epitaxially grown on the underlying substrate. In accordance with one embodiment of the invention, amorphous intermediate layer 116 is grown on substrate 102 at the interface between substrate 102 and the growing $(Ba,Sr)TiO_3$ layer by the oxidation of substrate 102 during the growth of layer 104.

Amorphous interface layer 116 is preferably an oxide formed by the oxidation of the surface of substrate 102, and more preferably is composed of a silicon oxide. Typically, layer 116 has a thickness in the range of approximately 0.5–5 nm.

$(La,Sr)CoO_3$ layers 106 and 108 are generally configured to allow generation of an electric field across PZT layer 110. Moreover, monocrystalline layer 106 allows monocrystalline formation of layer 110 over layer 106. In accordance with a preferred embodiment of the invention, layers 106 and 108 composition is $La_{0.5}Sr_{0.5}CoO_3$, and the layers are preferably greater than 30 nm and more preferably about 30–100 nm thick.

Monocrystalline piezoelectric PZT layer 110 exhibits greater piezoelectric effect compared to polycrystalline films of the same or similar material. Therefore, structures including this monocrystalline film are capable of producing a stronger electronic signal per amount of deformation in the film, and conversely, exhibit greater deformation per amount of electric field applied to the film. To provide the desired piezoelectric effect, layer 110 is preferably about 30–500 nm thick, and the composition is $Pb_{0.4}Zr_{0.6}TiO_3$.

Electrodes 112 and 114 facilitate electrical coupling to, respectively, layers 108 and 106, while providing a relatively inert electrode. In accordance with the present invention, electrodes 112 and 114 are about 100–200 nm thick.

The crystalline structure of the monocrystalline substrate 102 is characterized by a lattice constant and by a lattice orientation. In a similar manner, PZT layer 110 is also a monocrystalline material and the lattice of that monocrystalline material is characterized by a lattice constant and a crystal orientation. The lattice constants of the PZT layer and the monocrystalline silicon substrate must be closely matched or, alternatively, must be such that upon rotation of one crystal orientation with respect to the other crystal orientation, a substantial match in lattice constants is achieved. In this context the terms "substantially equal" and "substantially matched" mean that there is sufficient similarity between the lattice constants to permit the growth of a high quality crystalline layer on the underlying layer.

In accordance with one embodiment of the invention, substrate 102 is a (100) or (111) oriented monocrystalline silicon wafer and substantial matching of lattice constants between the silicon substrate and titanate layer 104 is achieved by rotating the crystal orientation of the titanate material by 45° with respect to the crystal orientation of the silicon substrate wafer.

Layers 106–110 are epitaxially grown monocrystalline material and these crystalline materials are also characterized by respective crystal lattice constants and crystal orientations. To achieve high crystalline quality in these epitaxially grown monocrystalline layers, the accommodating buffer layer must be of high crystalline quality. In addition, in order to achieve high crystalline quality in subsequently deposited films 106–110, substantial matching between the crystal lattice constant of the host crystal, in this case, the monocrystalline $(Ba,Sr)TiO_3$, and the grown crystal is desired.

The following example illustrates a process, in accordance with the present invention, for fabricating a microelectronic structure such as the structure depicted in the drawing FIGURE. The process starts by providing a monocrystalline semiconductor substrate comprising silicon. In accordance with a preferred embodiment of the invention, the semiconductor substrate is a silicon wafer having a (100) orientation. The substrate is preferably oriented on axis or, at most, about 0.5° off axis. At least a portion of the semiconductor substrate has a bare surface, although other portions of the substrate, as described below, may encompass other structures. The term "bare" in this context means that the surface in the portion of the substrate has been cleaned to remove any oxides, contaminants, or other foreign material. As is well known, bare silicon is highly reactive and readily forms a native oxide. The term "bare" is intended to encompass such a native oxide. A thin silicon oxide may also be intentionally grown on the semiconductor substrate, although such a grown oxide is not essential to the process in accordance with the invention. In order to epitaxially grow a monocrystalline $(Ba,Sr)TiO_3$ layer overlying the monocrystalline silicon substrate, the native oxide layer must first be removed to expose the crystalline structure of the underlying substrate. The following process is preferably carried out by molecular beam epitaxy (MBE), although other epitaxial processes may also be used in accordance with the present invention. The native oxide can be removed by first thermally depositing a thin layer of strontium, barium, or a combination of strontium and barium in an MBE apparatus. In the case where strontium is used, the substrate is then heated to a temperature of about 750° C. to cause the strontium to react with the native silicon oxide layer. The strontium serves to reduce the silicon oxide to leave a silicon oxide-free surface. The resultant surface, which exhibits an ordered 2×1 structure, includes strontium, oxygen, and silicon. The ordered 2×1 structure forms a template for the ordered growth of an overlying titanate layer. The template provides the necessary chemical and physical properties to nucleate the crystalline growth of an overlying layer.

In accordance with an alternate embodiment of the invention, the native silicon oxide can be converted and the substrate surface can be prepared for the growth of a monocrystalline oxide. layer by depositing strontium oxide, strontium barium oxide, or barium oxide, onto the substrate surface by MBE at a low temperature and by subsequently heating the structure to a temperature of about 750° C. At this temperature, a solid state reaction takes place between the strontium oxide and the native silicon oxide, causing the reduction of the native silicon oxide and leaving an ordered 2×1 structure with strontium, oxygen, and silicon remaining on the substrate surface. Again, this forms a template for the subsequent growth of an ordered monocrystalline titanate layer.

Following the removal of the silicon oxide from the surface of the substrate, in accordance with one embodiment of the invention, the substrate is cooled to a temperature in the range of about 200–800° C. and a layer (e.g., about 9–11 nm)of strontium titanate is grown on the template layer by molecular beam epitaxy. The MBE process is initiated by opening shutters in the MBE apparatus to expose strontium, titanium and oxygen sources. The ratio of strontium and titanium is approximately 1:1. The partial pressure of oxygen is initially set at a minimum value to grow stochiometric strontium titanate at a growth rate of about 0.3–0.5 nm per minute. After initiating growth of the strontium titanate, the partial pressure of oxygen is increased above the initial minimum value. The overpressure of oxygen causes the growth of an amorphous silicon oxide layer at the interface between the underlying substrate and the growing strontium titanate layer. The growth of the silicon oxide layer results from the diffusion of oxygen through the growing strontium titanate layer to the interface where the oxygen reacts with silicon at the surface of the underlying substrate. The strontium titanate grows as an ordered monocrystal with the crystalline orientation rotated by 45° with respect to the ordered 2×1 crystalline structure of the underlying substrate.

After the strontium titanate layer has been grown to the desired thickness, the monocrystalline strontium titanate may be capped by a template layer that is conducive to the subsequent growth of an epitaxial layer of a desired piezoelectric material. For example, the MBE growth of the strontium titanate monocrystalline layer can be capped by terminating the growth with 1–2 monolayers of titanium, 1–2 monolayers of titanium-oxygen or with 1–2 monolayers of strontium-oxygen.

Following the formation of the template (or, if no template is formed, after formation of the titanate layer), the (La,Sr) $CoO_3$material is grown using sputter deposition. More particularly, the (La,Sr) $CoO_3$ layer is grown by RF magnetron sputtering (face to face configuration) from a compressed $(La,Sr)CoO_3$ target. The deposition is performed with oxygen as sputter gas, and a substrate temperature of about 400–600° C.

Next, PZT layer 110 is formed over $(La,Sr)CoO_3$ layer 106 using a spin-on, sol-gel coating technique, then calcined and crystallized between 450° C. and 800° C. to form a monocrystalline layer. PZT layer 110 may also be formed using PVD or CVD techniques.

Electrodes 112 and 114 are subsequently formed over monocrystalline layers 106 and 108 using sputter deposition techniques to deposit the electrode material (e.g., platinum or iridium) and subsequently patterning and etching the material to remove the material from a portion of layers 106 and 108. For example, platinum may be deposited over $(La,Sr)CoO_3$ layers 106 and 108 by sputtering material from a platinum target onto the (La,Sr) $CoO_3$ layer using RF magnetron sputtering in an inert environment. After the platinum is deposited, the platinum may be photolithographically patterned and etched using a suitable wet or dry etch environment to form electrode 112 and 114.

In the foregoing specification, the invention has been described with reference to specific embodiments. However, one of ordinary skill in the art appreciates that various modifications and changes can be made without departing from the scope of the present invention as set forth in the claims below. Accordingly, the specification and FIGURE are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential features or elements of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

We claim:

1. A perovskite heterostructure comprising:
   a monocrystalline silicon substrate;
   a first layer of monocrystalline oxide comprising $(Sr,Ba)TiO_3$ overlying the monocrystalline silicon substrate;
   a second monocrystalline layer comprising $(La,Sr)CoO_3$ overlying the first layer;
   a third monocrystalline layer comprising $Pb(Zr,Ti)O_3$ overlying the second monocrystalline layer; and
   a fourth monocrystalline layer comprising $(La,Sr)CoO_3$ overlying the third monocrystalline layer.

2. The perovskite heterostructure of claim 1 further comprising an amorphous layer underlying the first layer.

3. The perovskite heterostructure of claim 1 further comprising a first metallic electrode coupled to the second monocrystalline layer and a second metallic electrode coupled to the fourth monocrystalline layer.

4. The perovskite heterostructure of claim 3 wherein the first metallic electrode and the second metallic electrode each comprise a metal selected from the group consisting of platinum and iridium.

5. The perovskite heterostructure of claim 3 wherein the second monocrystalline layer, third monocrystalline layer, fourth monocrystalline layer and the first and second metallic electrodes comprise a device selected from the group consisting of piezoelectric actuators, piezoelectric transducers, and ferroelectric memory cells.

6. The perovskite heterostructure of claim 1 wherein the first layer has a thickness of about 9–11 nm.

7. The perovskite heterostructure of claim 1 wherein the second monocrystalline layer and the fourth monocrystalline layer each have a thickness greater than about 100 nm.

8. The perovskite heterostructure of claim 7 wherein the third monocrystalline layer has a thickness greater than about 200 nm.

9. The perovskite heterostructure of claim 1 wherein the third monocrystalline layer has a thickness greater than about 200 nm.

10. The perovskite heterostructure of claim 9 wherein the second monocrystalline layer has a thickness greater than about 100 nm.

11. The perovskite heterostructure of claim 10 further comprising an amorphous layer underlying the first layer.

12. The perovskite heterostructure of claim 1 wherein the second monocrystalline layer comprises $La_{0.5}Sr_{0.5}CoO_3$.

13. A perovskite heterostructure comprising:
    a monocrystalline silicon substrate;
    a first monocrystalline layer comprising $(Ba,Sr)TiO_3$ overlying the monocrystalline silicon substrate;
    a layer of silicon oxide formed underlying the first monocrystalline layer;
    a second monocrystalline layer comprising $(La,Sr)CoO_3$ overlying the first monocrystalline layer;
    a first electrode electrically contacting the second monocrystalline layer;
    a third monocrystalline layer comprising $Pb(Zr,Ti)O_3$ overlying the second monocrystalline layer;
    a fourth monocrystalline layer comprising $(La,Sr)CoO_3$ overlying the third monocrystalline layer; and
    a second electrode electrically contacting the fourth monocrystalline layer.

14. The perovskite heterostructure of claim 13 wherein each of the second and fourth monocrystalline layers comprises $La_{0.5}Sr_{0.5}CoO_3$.

15. The perovskite heterostructure of claim 1 wherein the monocrystalline silicon substrate has a (100) crystal orientation, and the first monocrystalline layer comprising $(Sr,Ba)TiO_3$ has a 45° orientation with respect to the crystal orientation of the monocrystalline silicon substrate.

16. The perovskite heterostructure of claim 13 wherein the monocrystalline silicon substrate has a (100) crystal orientation, and the first layer of monocrystalline oxide comprising $(Ba,Sr)TiO_3$ has a 45° orientation with respect to the crystal orientation of the monocrystalline silicon substrate.

* * * * *

UNITED STATES PATENT AND TRADEMARK OFFICE
CERTIFICATE OF CORRECTION

PATENT NO. : 6,432,546 B1
DATED : August 13, 2002
INVENTOR(S) : Ramesh et al.

It is certified that error appears in the above-identified patent and that said Letters Patent is hereby corrected as shown below:

Title page,
Item [73], Assignee, in addition to "Motorola, Inc., Schaumburg, IL, please list as joint assignee -- University of Maryland, College Park, MD --

Signed and Sealed this

Seventh Day of September, 2004

JON W. DUDAS
*Director of the United States Patent and Trademark Office*